(12) United States Patent
Zhuang et al.

(10) Patent No.: US 12,538,833 B2
(45) Date of Patent: Jan. 27, 2026

(54) BALL BONDING FOR SEMICONDUCTOR DEVICES

(71) Applicant: TEXAS INSTRUMENTS INCORPORATED, Dallas, TX (US)

(72) Inventors: Ye Zhuang, Chengdu (CN); Zi Qi Wang, Deyang (CN); Xiao Lin Kang, Chengdu (CN); Tingting Yu, Chengdu (CN); Jiafeng Liao, Chengdu (CN); Xiaoling Kang, Chengdu (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 401 days.

(21) Appl. No.: 18/113,797

(22) Filed: Feb. 24, 2023

(65) Prior Publication Data

US 2024/0290746 A1 Aug. 29, 2024

(51) Int. Cl.
*H01L 23/00* (2006.01)
*H01L 21/56* (2006.01)
*H01L 23/495* (2006.01)

(52) U.S. Cl.
CPC .......... *H01L 24/48* (2013.01); *H01L 21/565* (2013.01); *H01L 23/4952* (2013.01); *H01L 24/05* (2013.01); *H01L 24/45* (2013.01); *H01L 24/78* (2013.01); *H01L 24/85* (2013.01); *H01L 2224/04042* (2013.01); *H01L 2224/05553* (2013.01); *H01L 2224/45144* (2013.01); *H01L 2224/45147* (2013.01); *H01L 2224/48227* (2013.01); *H01L 2224/48465* (2013.01); *H01L 2224/78301* (2013.01); *H01L 2224/85205* (2013.01)

(58) Field of Classification Search
CPC .......... H01L 24/48; H01L 2224/48451; H01L 24/16; H01L 24/08
See application file for complete search history.

(56) References Cited

U.S. PATENT DOCUMENTS

| | | | |
|---|---|---|---|
| 1,019,568 A | 3/1912 | Weintraub | |
| 10,692,835 B2 | 6/2020 | Zhong et al. | |
| 2005/0092815 A1* | 5/2005 | Mii .......................... | H01L 24/48 228/180.5 |
| 2006/0175383 A1* | 8/2006 | Mii ....................... | B23K 20/007 228/180.5 |
| 2011/0272449 A1 | 11/2011 | Pirkle et al. | |
| 2017/0229419 A1 | 8/2017 | Hashim et al. | |
| 2024/0188215 A1* | 6/2024 | Hung .................... | H05K 1/113 |

OTHER PUBLICATIONS

Yan Huang; A. Shah; M. Mayer; N. Zhou; J. Persic (2010). Effect of ultrasonic capillary dynamics on the mechanics of thermosonic ball bonding. , 57(1), 241-252. doi:10.1109/TUFFC.2010.1402.

* cited by examiner

*Primary Examiner* — Yu-Hsi D Sun
(74) *Attorney, Agent, or Firm* — Ronald O. Neerings; Frank D. Cimino

(57) ABSTRACT

A semiconductor device includes a semiconductor die having a die surface, in which the die surface includes a bond pad. A ball bond has a distal surface and flattened-disk shape extending from the distal surface and terminating in a proximal surface spaced apart from the distal surface. The distal surface is coupled to the bond pad and a channel extends a depth into the proximal surface surrounding a central portion of the proximal surface. A bond wire extending from the central portion of the proximal surface, in which the channel is spaced apart from and surrounds the bond wire.

8 Claims, 5 Drawing Sheets

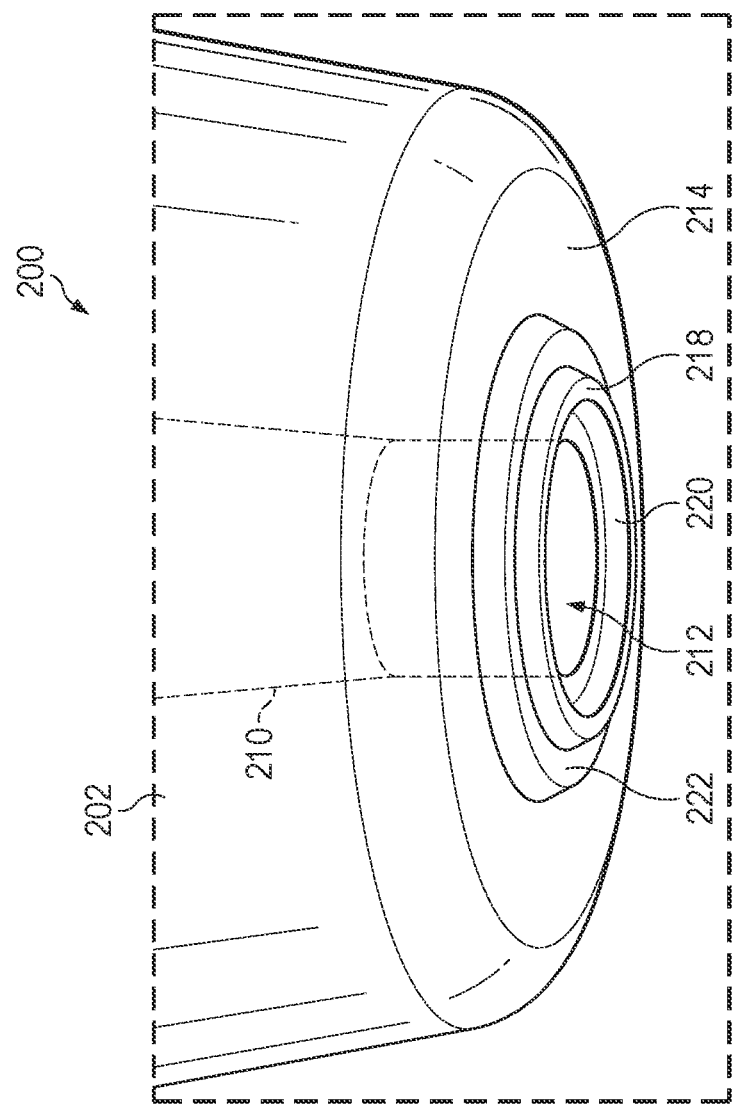
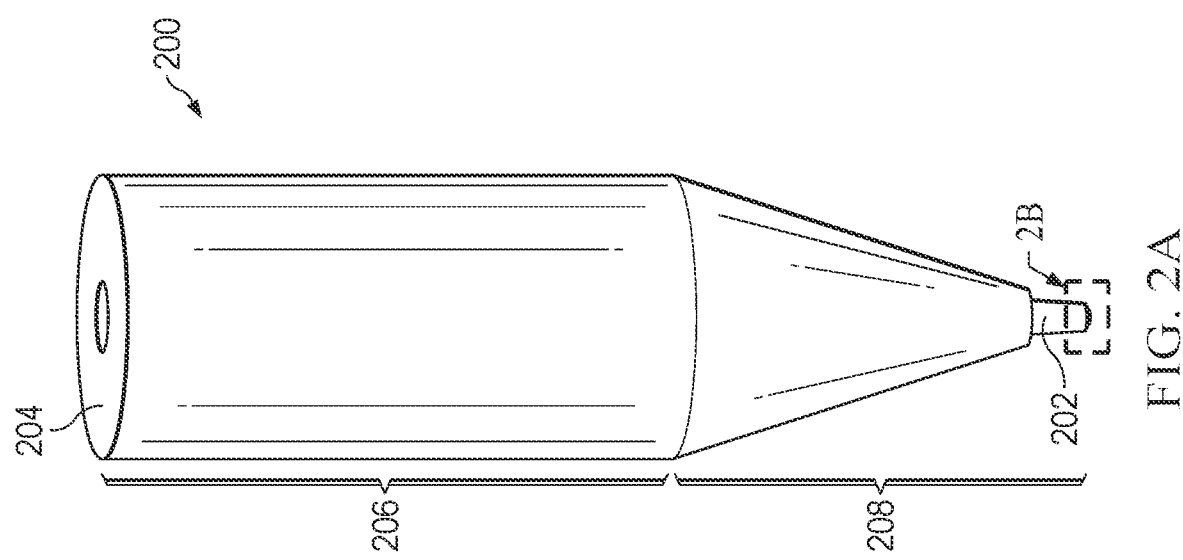

BALL BONDING FOR SEMICONDUCTOR DEVICES

TECHNICAL FIELD

This description relates to ball bonding for semiconductor devices.

BACKGROUND

Wirebonding is used to electrically connect contacts within a semiconductor package. A metal wire (e.g., gold, copper, etc.) has one end ball-bonded to a bond pad on semiconductor die, and another end stitch (or wedge) bonded to a lead on a lead frame. In order to form such connections, the wire is fed through a capillary associated with a moveable bond head. For a ball bond, a ball is formed on the exposed end of the wire. The ball is pulled against the end of the capillary and is then pressed into position on a pre-heated bond pad where a combination of heat, pressure, and ultrasonic vibration is used to cause the ball to adhere to the surface of the bond pad. With the ball end of the wire secured to the bond pad, the wire can be payed out through the capillary as the bond head moves into position at the appropriate lead on the lead frame. A stitch bond can then be formed on the lead, and a tail wire is payed out through the capillary, clamped, and then cut. A new ball is then formed readying the wire end for the next ball bond, and the cycle is repeated.

SUMMARY

An example semiconductor device includes a semiconductor die having a die surface, in which the die surface includes a bond pad. A ball bond has a distal surface and flattened-disk shape extending from the distal surface and terminating in a proximal surface spaced apart from the distal surface. The distal surface is coupled to the bond pad and a channel extends a depth into the proximal surface surrounding a central portion of the proximal surface. A bond wire extending from the central portion of the proximal surface, in which the channel is spaced apart from and surrounds the bond wire.

An example method of making a semiconductor device includes providing a ball at a first end of a conductive wire inserted in a central aperture of a capillary tool, in which the capillary tool has a boss protruding from a distal end tip thereof. The method also includes lowering the capillary tool toward a bond pad on a semiconductor die, which is positioned on a substrate, to sandwich the ball between the distal end tip and the bond pad. The method also includes forming a ball bond on the bond pad responsive to vibrating the capillary tool ultrasonically while the distal end tip, including the boss, engages a proximal surface of the ball. The boss forms a channel in the proximal surface of the ball bond surrounding a length of the conductive wire extending from a central portion of the proximal surface of the ball. The method also includes raising the capillary tool away from the semiconductor die along the length of the conductive wire.

Another example method includes vibrating a capillary tool ultrasonically to form a ball bond on a bond pad of a semiconductor die while a distal end tip of the capillary tool, which includes a boss, urges a ball of conductive material into contact with the bond pad and forms a channel in a proximal surface of the ball bond around a length of a conductive wire extending from the proximal surface of the ball bond.

An example apparatus includes a capillary tool having a proximal end, a distal end, and a central aperture extending axially through the capillary tool between the proximal and distal ends. The central aperture is configured to receive a length of bonding wire therethrough. The distal end of the capillary tool has a boss protruding axially from the distal end, and the boss is configured to form a channel in a surface of a ball bond during wire bonding responsive to vibrating the capillary tool.

BRIEF DESCRIPTION OF THE DRAWINGS

FIGS. 2A and 2B depict an example capillary tool with an enlarged isometric view of the tip of the tool.

DETAILED DESCRIPTION

This description relates to ball bonding for semiconductor devices, including semiconductor devices and methods of making semiconductor devices.

As an example, a semiconductor device includes a semiconductor die mounted to a substrate, such as mounted to a die pad of a lead frame. The die includes a die surface having a number of bond pads. The substrate (e.g., lead frame) can also have a number of bond pads. For the lead frame example, the bond pads are coupled to leads (e.g., pins or other electrical contacts).

As described herein, ball bonds are formed on respective bond pads of the semiconductor die. For example, a capillary tool has a distal tip, and a ball is provided at a first end of a bond wire that extends through the capillary tool adjacent the distal tip. The capillary tool configured to form a ball bond having a flattened-disk shape extending from a distal surface and terminating in a proximal surface spaced apart from the distal surface. The distal surface of the ball bond adheres to the bond pad during a wire bonding process (e.g., responsive to ultrasonic vibrations and/or heating applied to the ball bond). The distal tip of the capillary tool is also configured to form a channel in the proximal surface of the ball bond during wire bonding. The channel can extend a depth into the proximal surface around a central portion of the proximal surface of the ball bond, from which a bond wire can extend. In an example, the channel is spaced apart from and surrounds (e.g., continuously) the periphery of the bond wire. A plurality of wire bonds can be formed (e.g., by the capillary tool) to couple the bond pads of the die to respective bond pads of the lead frame. After desired wire bonds have been formed, the semiconductor die, the bond wires, and a portion of the lead frame can be encapsulated in a molding material to form a packaged semiconductor device.

By using the capillary tool to form the wire bonds, as described herein, the ultrasonic energy transfer from the capillary tool to the ball can be improved even with application of lower force between the distal end of the tool and the ball bond. Also, the approach described herein can provide an improved throughput in the overall wire bonding process because of the efficient energy application.

Figure 1:
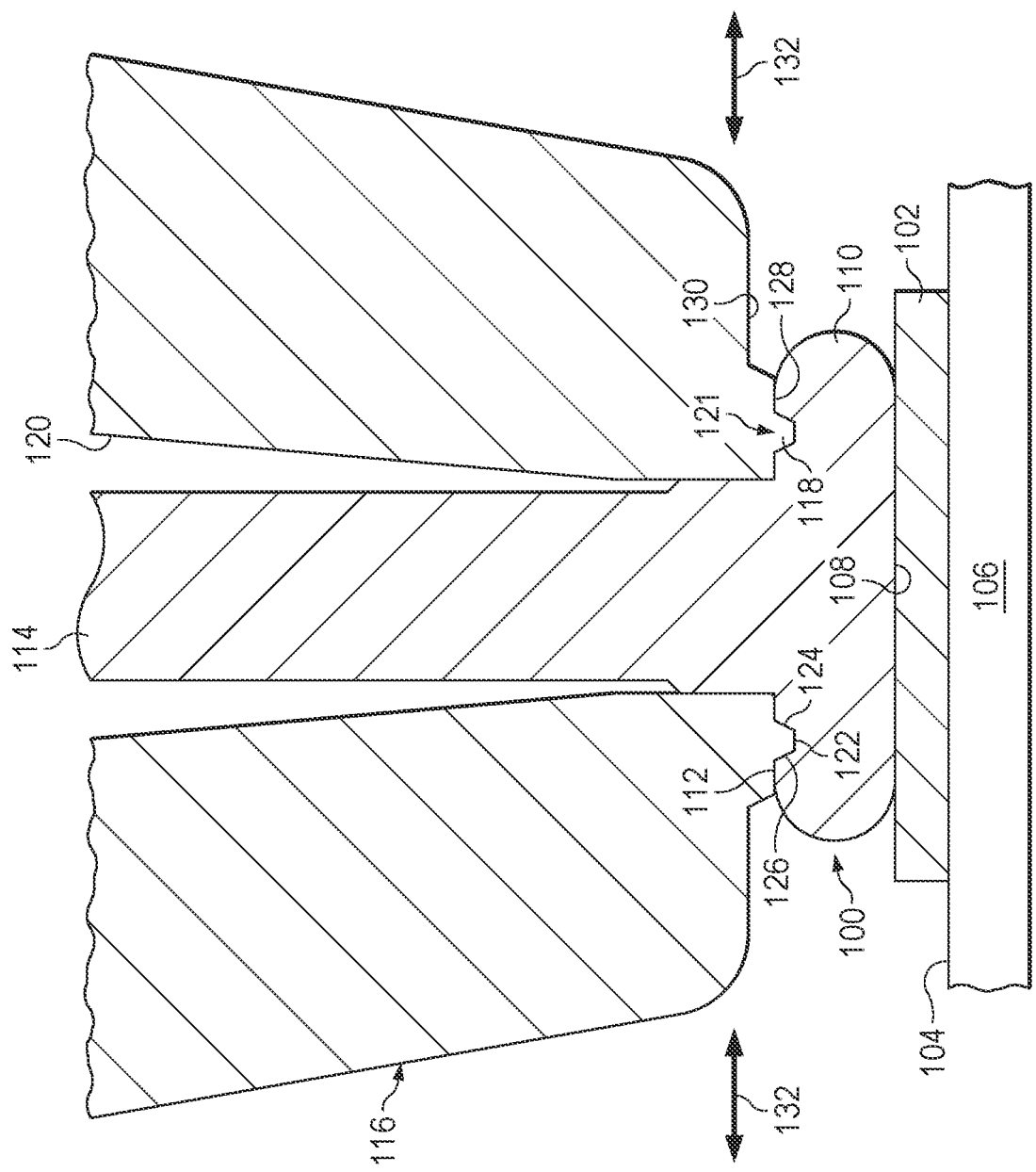
FIG. 1 is a cross-sectional view of an example ball bond being formed.

FIG. 1 is a cross-sectional view of an example ball bond 100 being formed on bond pad 102, such as part of a wire bonding process. For example, the bond pad 102 is one of a number of bond pads on a surface 104 of a substrate 106, typically a surface of a semiconductor die. The ball bond 100 has a distal surface 108 coupled to a surface of the bond pad 102 and configured to adhere to the bond pad through the bonding process. The ball bond 100 a sidewall portion 110, having a flattened-disk shape (e.g., an oblate spheroidal shape), extending from the distal surface to terminate in a proximal surface 112 of the ball bond. A length of a bond wire 114 extends from a central portion of the proximal surface 112.

In the example of FIG. 1, a tip portion of a capillary wire bonding tool (also referred to as a capillary or capillary tool) 116 is configured to form the ball bond 100. The tip portion of the capillary tool 116 includes a boss 118 extending axially from the distal end of the tip and a central aperture 120 extending axially through the capillary tool. The aperture 120 has an inner diameter that is configured to receive a length of bond wire 114 therethrough. In an example, the inner diameter of the aperture 120 can be fixed or the inner diameter can vary, such as having a conical shape of increasing diameter from the distal end toward a proximal end thereof.

As described herein, the boss 118 is configured to form a channel (e.g., a groove or inset) 121 that extends into the proximal surface 112 of the ball bond 100 being formed during the wire bonding process. The channel 121 is spaced apart radially outwardly from and surrounds the bond wire 114. In an example, the boss 118 is an annular protruding feature of the distal end of the capillary tool 116, such as extending continuously around the central aperture 120. In other examples, the boss 118 can be implemented as segmented or spaced apart sectional features protruding from the distal end of the capillary tool 116 around the aperture 120.

In the cross-sectional example shown in FIG. 1, the boss 118 has a flat distal edge 122 and flat radially inner and outer sidewalls 124 and 126, respectively, extending in an axial direction from the distal edge, thus providing a rectangular or trapezoidal cross-sectional shape for the boss 118. The radially inner sidewall 124 can be spaced radially outwardly the inner wall of the aperture 120, such that the channel is spaced radially outwardly from the periphery of the bond wire 114. The boss 118 can also include a spacer portion 128 that provides a step between the outer sidewall 126 and the end 130 of the main tip body from which the boss 118 extends. For example, the spacer portion 128 has an axial thickness configured to maintain a space (e.g., separate) the end 130 from the proximal surface 112 of the ball bond 100. The spacer portion 128 can have an annular shape coextensive with the outer sidewall 126 of the boss 118. In other examples, the boss 118 can be implemented with other shapes and/or curved/chamfered corners between respective surfaces. The shape of the boss 118 can improve transfer of energy from the capillary tool 116 to the ball bond 100 responsive to vibrating (e.g., ultrasonically) the capillary tool, such as shown in the direction of arrows 132, and/or application of heat as the distal end of the tool pushes the ball bond 100 in a direction orthogonal to the surface of the bond pad 102 during bonding. The frequency of the ultrasonic vibrations of the capillary tool 116 can be fixed (e.g., greater than 20 KHz), such as responsive to applying electrical current to an ultrasonic transducer (not shown) to which the capillary tool is coupled.

FIGS. 2A and 2B depict an example capillary tool 200 with an enlarged isometric view of a portion of a distal tip of the tool, shown at 202. The capillary tool 200 has a proximal end 204 that is opposite the tip 202 and has a length extending between the tip 202 and the end 204, which can vary depending on application requirements. The capillary tool 200 can have a cylindrical portion 206 and a tapered portion 208, in which the tip 202 extends from a distal end of the tapered portion. The cylindrical portion 206 may have a circular cylindrical shape or other shape adapted to be received in a capillary mount (not shown). The tapered portion 208 provides the transition between the cylindrical portion 206 and the tip 202. The tapered portion 208 may be linear (e.g., conical) or it may have a curved shape.

Referring to the enlarged portion shown in FIG. 2B, the capillary tool 200 also has a central aperture 210 extending axially through the tool. The aperture 210 can have different diameters within different parts of the capillary tool 200, but sufficient to enable passage of a length of bond wire through the aperture. The tip 202 also has an opening 212 at a distal end 214 of the capillary tool 200 to provide access to the aperture 210. The aperture 210 is configured to permit the passage of bond wire to a surface (e.g., bond pad) being wire bonded by a wire bonding machine.

In the example of FIG. 2B, the tip 202 includes a boss 218 extending axially from the distal end 214 of the tip. The boss 218 includes one or more an annular protruding structures spaced from and surrounding the opening 212. As shown in FIG. 2B, the boss 218 has a rectangular or trapezoidal cross-sectional shape (see, e.g., FIG. 1). For example, the boss 218 has an isosceles trapezoidal shape, in which the base angles have the same measure its radially inner and outer sidewalls are also of equal length and it has reflection symmetry. The boss can have other shapes in other examples. A radially inner sidewall 220 of the boss 218 can be spaced radially outwardly the opening 212 of the aperture 210, such as to locate the distal most portion of the boss radially outwardly from a periphery of the bond wire. The boss 218 can also include a spacer 222 having an annular shape and extends radially outwardly from a radially outer sidewall of the boss 218. The spacer also has an axial thickness configured to separate the distal most part of the boss 218 and the end 214 of the tip from which the boss 218 extends.

Figure 3:
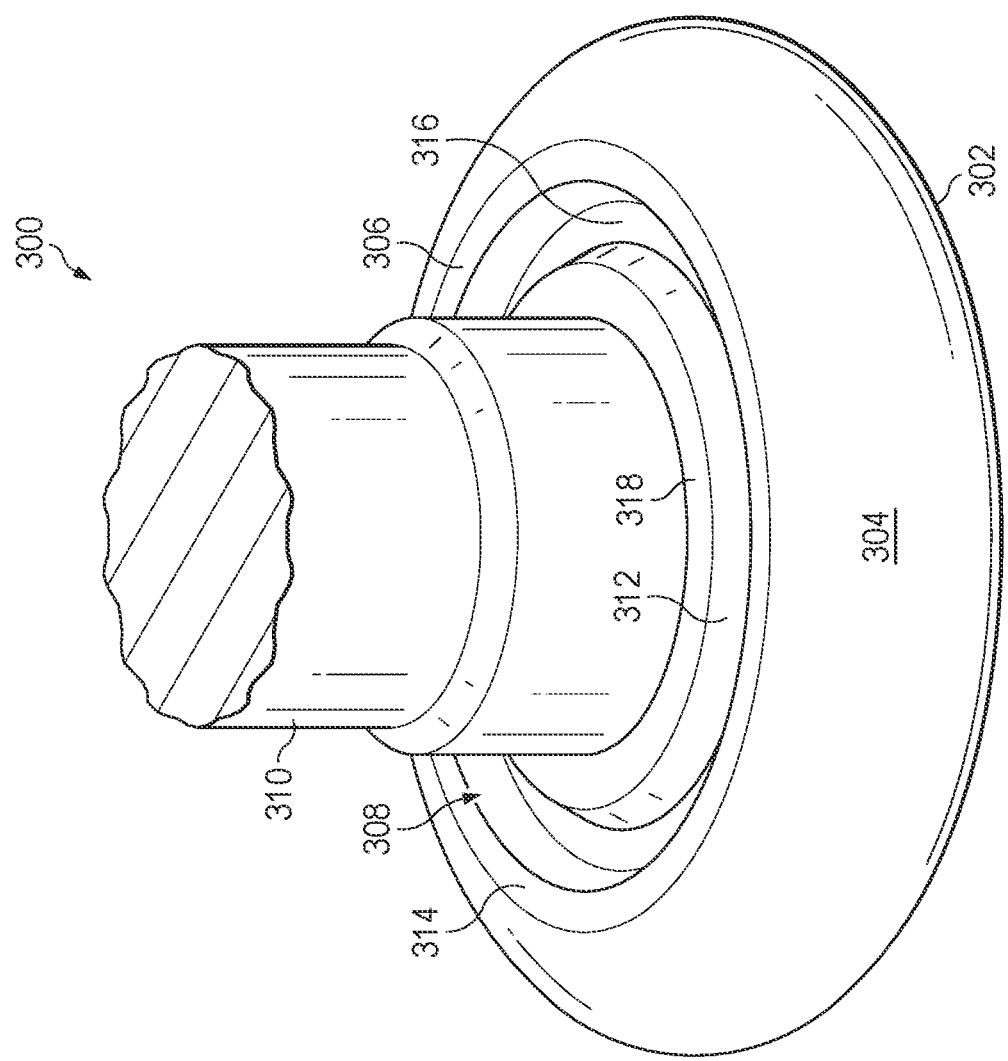
FIG. 3 is an isometric view of an example ball bond that can be produced by the tool of FIGS. 2A and 2B.

FIG. 3 is an isometric view showing an example ball bond 300, such as can be formed on a bonding using the capillary tool 200 of FIGS. 2A and 2B. Accordingly, the description of FIG. 3 also refers to the description of FIGS. 2A and 2B. The ball bond 300 has a distal surface 302, which has a surface contoured according to the contour bonding surface where the ball bond is being formed. The ball bond 300 also has a flattened-disk shape body portion 304 extending from the distal surface 302 and terminating in a proximal surface 306. In an example, the outer sidewall surface of the body portion 304, generally excluding the proximal surface 306, has an oblate spheroidal shape (e.g., a flattened sphere). The shape of the body portion 304 can vary depending on the starting shape of the wire ball, the configuration of the distal end 214 of the capillary tool 200 and process parameters (e.g., temperature, force applied to the ball bond) during wire bond formation.

As shown in FIG. 3, the ball bond 300 includes an annular channel 308 surrounding a central portion of the proximal surface 306. For example, a length of a bond wire 310 extends from the central portion of the proximal surface 306, and channel 308 is spaced radially outwardly from and surrounds the bond wire 310. The channel 308 is sized and configured according to the size and configuration of the boss 218. The channel 308 has a radially inner sidewall 312, a radially outer sidewall 314 and a bottom wall 316 coupled between the sidewalls, in which the outer sidewall is spaced a distance radially outwardly from the inner sidewall. In an example, the channel 308 has a rectangular or trapezoidal cross-sectional shape, in which the surfaces of the respective walls 312, 314 and 316 are flat and intersecting edges thereof form angles. In other examples, the surfaces of the respective channel walls 312, 314 and 316 can be curved or have other contoured shapes, including chamfered or curved intersecting edges between such surfaces, such as described herein. The ball bond 300 can also have an annular ledge 318 along the central portion of the proximal surface 306, which spaces the sidewall 312 of the channel radially outwardly from the periphery of the bond wire 310. A distal portion of the bond wire 310, which is coupled to the central portion of the proximal surface can have a greater diameter that a proximal portion of the wire bond, which can be defined by the diameter of the aperture 210 at the distal tip 202 of the capillary tool 200.

Figure 4:
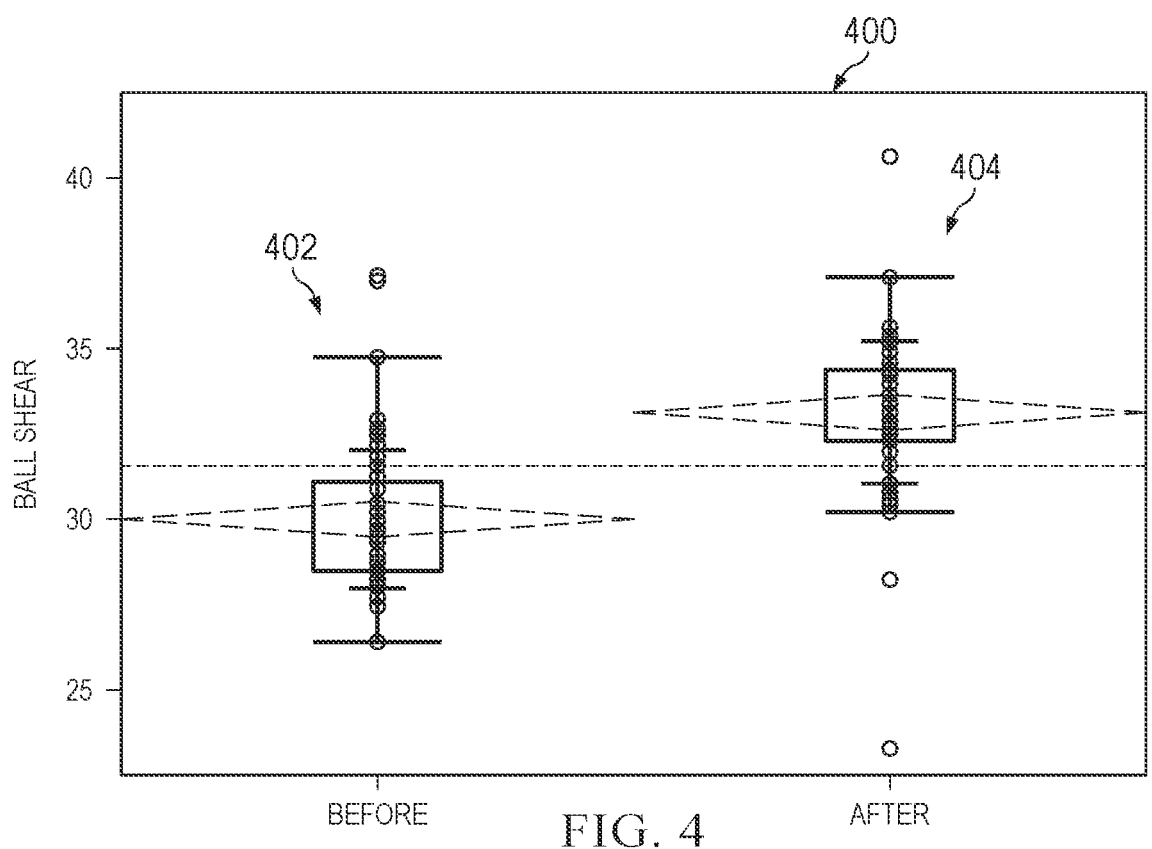
FIG. 4 is diagram showing comparative examples of ball shear for ball bonds formed using different approaches.

FIG. 4 is a diagram 400 showing comparative examples of ball shear for ball bonds formed using different approaches. The diagram 400 includes a plot 402 of data representative of shear for ball bonds formed using an existing type of capillary tool. The diagram 400 also includes a plot 404 of data representative of shear for ball bonds formed using a capillary tool having a boss at the distal end thereof, as described herein. FIG. 4 thus demonstrates improved bonding characteristics resulting from using a capillary tool, as described herein. As a result of the increased shear from using a capillary tool (e.g., 116 or 200), as described herein, the likelihood of a ball bond lifting off a bond pad can be reduced compared to existing approaches.

Figure 5:
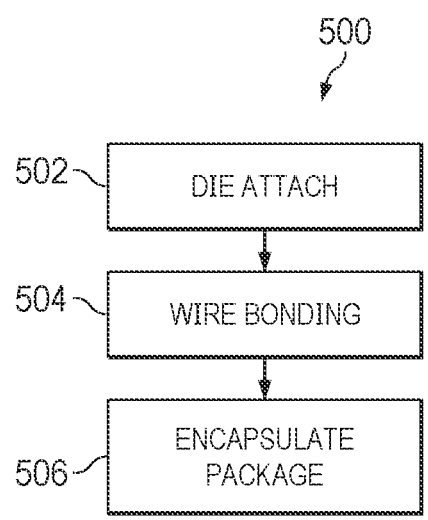
FIG. 5 is a flow diagram showing an example method of making a semiconductor device.

FIG. 5 is a flow diagram showing an example method 500 of making a semiconductor device. The method 500 is described in reference to FIGS. 6 and 7, which show the semiconductor device at different stages of fabrication. While, for purposes of simplicity of explanation, the method of FIG. 5 is shown and described as executing serially, the method is not limited by the illustrated order, as some actions could occur in different orders, multiple times and/or concurrently from that described herein.

Figure 6:
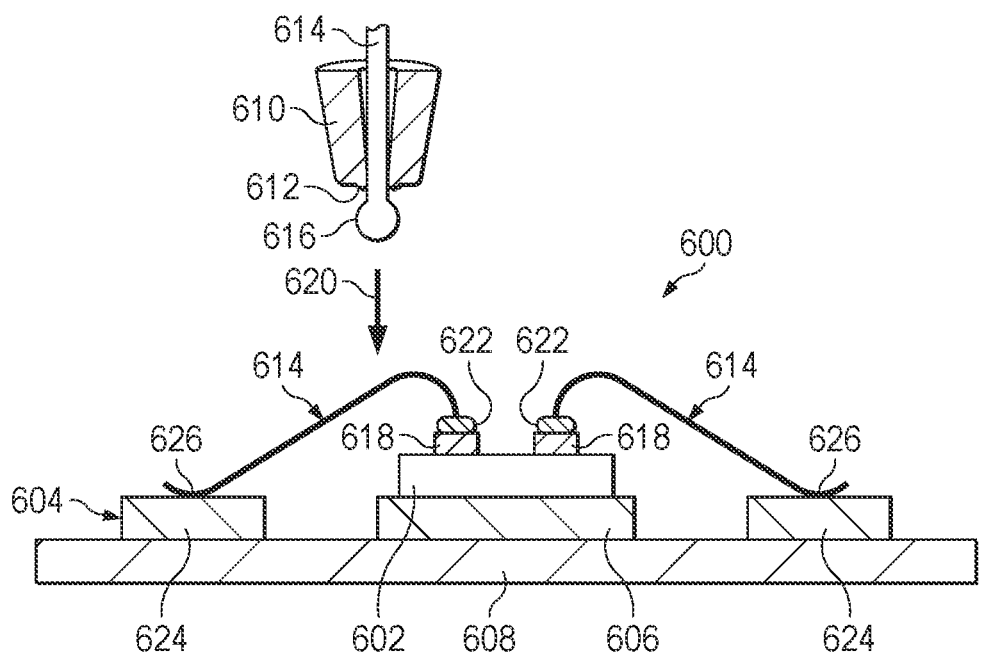
FIGS. 6 and 7 are cross-sectional views show an example semiconductor device being formed.

The method 500 begins at 502 by performing a die attach process. For example, FIG. 6 shows a semiconductor device 600 that includes a die 602 that has been singulated from a wafer and on which integrated circuitry has been formed. The die 602 has a top side that includes an arrangement of conductive terminals (e.g., aluminum or copper bond pads) for electrical coupling to respective leads of a lead frame 604. The bottom side of the die 602 is placed on and mounted to a surface of a die pad 606 of the lead frame 604, such as using pick and place equipment, and the die pads remain exposed. The die attachment at 502 can be performed using an adhesive attachment material or soldering.

At 504, the method 500 includes performing wire bonding. The wire bonding at 504 can be applied to electrically couple bond pads of one or more dies to leads of a respective lead frame. The bond wires, each include a first end connected (e.g., soldered or ultrasonically welded) to a corresponding conductive terminal of the die, and a second end connected (e.g., soldered or ultrasonically welded) to the lead.

For example, as schematically shown in FIG. 6, a wire bonding tool includes a capillary 610 having a central aperture. The capillary tools 116 and 200 described herein, which include respective bosses 118 and 218, are useful examples of capillaries that can be used to implement the capillary 610. Likewise, the capillary 610 includes a boss 612 protruding from a distal end tip thereof. The capillary 610 can be implemented using any of various materials and have dimensions and configurations depending on the wire bonding application for which it is being used. A length of conductive wire 614 (e.g., copper, gold or aluminum wire) extends through a central aperture of the capillary 610. The wire 614 can be fed from a source of wire (e.g., spool) into the aperture of the capillary 610.

The wire bonding at 504 includes a series of subprocess steps to form each wire bond, in which a length of wire is coupled between respective bonding surfaces. The wire bonding at 504 includes providing a ball 616 at a distal end of a length of the wire 614. For example, a ball-forming mechanism, such as electronic flame-off (EFO), is activated to generate an electric spark that melts a distal end portion of the wire 614 to form the ball 616 at the end of the wire. The capillary 610, while carrying the ball 616, is then lowered toward a bond pad 618 on the surface of the die 602 in the direction indicated by arrow 620. The die 602 and lead frame 604 can be positioned on a support surface (e.g., bonding table), shown at 608. As the capillary 610 is lowered by wire bonding tool, force is applied (e.g., a force commensurate to force exerted by a weight of about 8 g to about 10 g) to sandwich the ball 616 between the distal end tip of the capillary 610 and the pad 618 to form a ball bond 622 on the pad. For example, an ultrasonic transducer is coupled to the capillary 610 and is configured to vibrate the capillary tool ultrasonically while the distal end tip, including the boss 612, engages a proximal surface of the ball 616 and urges the ball against the pad to flatten the spherical shaped ball into an oblate spheroidal shape. Heat (e.g., about 250 degrees Celsius) can also be applied during the bonding process to facilitate formation of the ball bonds 622, such as convection through a heat block or chuck beneath the die. As described herein, the boss 612 is configured to form a channel in the proximal surface of the ball bond surrounding a central portion of the proximal ball bond surface. The resulting ball bond 622, which can be an ultrasonic bond or a thermosonic bond, thus adheres to the pad 618.

The capillary 610 is then raised away from the semiconductor die along the length of the conductive bond wire 614. The capillary 610 is moved toward a bonding surface (e.g., pad) 624 on the lead frame (or other substrate) 604. The bonding surface 624 can be a bond pad coupled to a respective lead of the lead frame. The capillary can urge the distal end of the wire into the pad and apply energy (e.g., mechanical force and heat) to form a bond 626 between a distal end of the wire and the lead frame. The bond 626 can be implemented as a stitch bond or a wedge bond. For example, the stitch bond is formed by moving the capillary 610 to form a loop in the wire 614, moving the capillary over the contact point on the lead frame, lowering the capillary tool to the lead frame, bonding the wire to the lead frame (e.g., using scrubbing), clamping and pulling the wire from the lead frame to cut the wire. The wire 614 thus forms a wire bond that electrically couples the bond pad 618 of the semiconductor die 602 and respective bonding surfaces 624 on the lead frame 604. The wire bonding performed at 504 can be repeated to provide discrete wire bonds that electrically couple each of the plurality of bond pads 618 on the semiconductor die 602 and respective bonding surfaces 624 on the lead frame 604.

Figure 7:
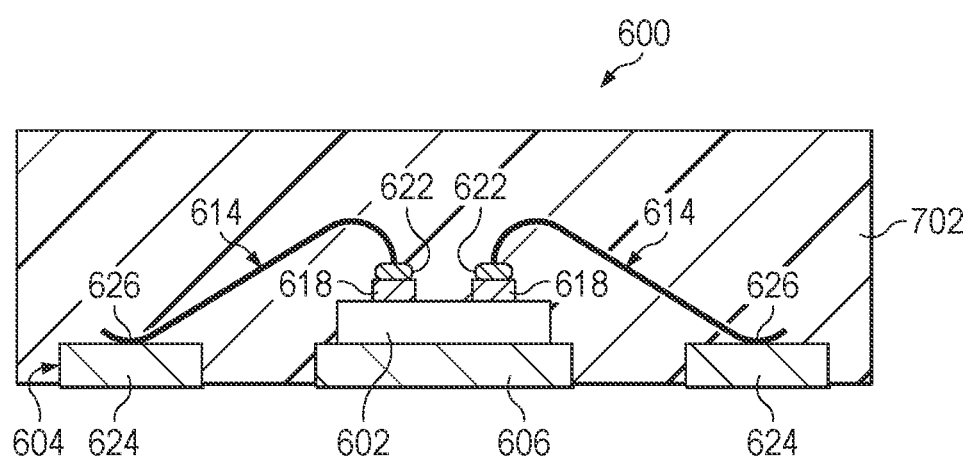

Once all of the bond pads 618 are wire bonded to bonding surfaces 624 on the lead frame 604, the method 500 proceeds to 506. At 506, the method includes encapsulating the semiconductor die, the wire bonds and at least a portion of the lead frame with a molding material. For example, as shown in FIG. 7, the encapsulation at 506 includes enclosing the die 602, the die pads 618, bond wires 614, bonding surfaces 624 and portions of the leads in molding material 702 to form a packaged semiconductor device 600. In an example, the encapsulation performed at 506 forms a discrete molded structure of an insulating material (e.g., plastic or epoxy material) that covers and encloses the die 602, bond wires 614 and other interconnections across the top surface of the lead frame 604.

In this description, the term "based on" means based at least in part on. Also, in this description, the term "couple" or "couples" means either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings.

Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device described herein as including certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure, either at a time of manufacture or after a time of manufacture, such as by an end user and/or a third party.

Modifications are possible in the described embodiments, and other embodiments are possible, within the scope of the claims.

What is claimed is:

1. A semiconductor device comprising:
   a semiconductor die having a die surface, in which the die surface includes a bond pad; and
   a ball bond having a distal surface and flattened-disk shape extending from the distal surface and terminating in a proximal surface spaced apart from the distal surface, in which the distal surface is coupled to the bond pad and a channel extends a depth into the proximal surface surrounding a central portion of the proximal surface; and
   a bond wire extending from the central portion of the proximal surface, in which the channel is spaced apart from and surrounds the bond wire.

2. The semiconductor device of claim 1, further comprising a lead frame that includes a die pad and plurality of pads, in which the bond wire is coupled between a respective pad of the plurality of pads of the lead frame and the bond pad of the semiconductor die.

3. The semiconductor device of claim 2, further comprising:
   a plurality of bond pads on the die surface;
   a plurality of ball bonds, in which each of the ball bonds has a distal surface coupled to a respective bond pad on the die surface and a channel extending into the proximal surface thereof surrounding a respective central portion of the proximal surface; and
   a plurality of bond wires, in which each of the bond wires extends between the central portion of a respective ball bond and a respective pad of the lead frame.

4. The semiconductor device of claim 3, further comprising molding material encapsulating the semiconductor die, the bond wires, and a portion of the lead frame.

5. The semiconductor device of claim 1, wherein the channel has an inner sidewall, an outer sidewall and a surface coupled between the sidewalls, in which the outer sidewall is spaced a distance radially outwardly from the inner sidewall.

6. The semiconductor device of claim 5, wherein the channel has a rectangular or trapezoidal cross-sectional shape.

7. The semiconductor device of claim 1, wherein the bond pad is aluminum or an alloy thereof.

8. The semiconductor device of claim 1, wherein the channel extends continuously around the central portion of the proximal surface.

\* \* \* \* \*